(12) United States Patent  
Ramakrishna et al.

(10) Patent No.: US 8,106,496 B2  
(45) Date of Patent: Jan. 31, 2012

(54) SEMICONDUCTOR PACKAGING SYSTEM WITH STACKING AND METHOD OF MANUFACTURING THEREOF

(75) Inventors: Kambhampati Ramakrishna, Chandler, AZ (US); Il Kwon Shim, Singapore (SG); Seng Guan Chow, Singapore (SG)

(73) Assignee: Stats Chippac, Inc., Fremont, CA (US)

( * ) Notice: Subject to any disclaimer, the term of this patent is extended or adjusted under 35 U.S.C. 154(b) by 182 days.

(21) Appl. No.: 11/757,869

(22) Filed: Jun. 4, 2007

(65) Prior Publication Data

US 2008/0296759 A1 Dec. 4, 2008

(51) Int. Cl.
*H01L 23/48* (2006.01)
*H01L 21/60* (2006.01)

(52) U.S. Cl. ........... 257/685; 257/E23.031; 257/E31.11; 257/E21.506; 257/723; 257/737; 257/738; 257/778; 257/786; 257/784; 257/434

(58) Field of Classification Search .................. 257/685, 257/686, 723, 737, 738, 778, 784, 786, 434, 257/E23.031, E31.11, E21.506; 438/123
See application file for complete search history.

(56) References Cited

U.S. PATENT DOCUMENTS

| | | | | |
|---|---|---|---|---|
| 5,355,283 A * | 10/1994 | Marrs et al. | ................... | 361/760 |
| 5,554,887 A * | 9/1996 | Sawai et al. | ................... | 257/737 |
| 5,891,606 A * | 4/1999 | Brown | ......................... | 430/312 |
| 6,373,125 B1 * | 4/2002 | Pannaccione et al. | ........ | 257/666 |
| 6,498,393 B2 * | 12/2002 | Fujimoto et al. | ............... | 257/692 |
| 6,948,944 B2 * | 9/2005 | Ueno | ............................... | 439/68 |
| 6,953,988 B2 * | 10/2005 | Seo et al. | ........................ | 257/666 |
| 7,091,820 B2 * | 8/2006 | Fjelstad | .......................... | 338/312 |
| 7,129,113 B1 * | 10/2006 | Lin et al. | ........................ | 438/109 |
| 7,138,707 B1 * | 11/2006 | Lee et al. | ........................ | 257/684 |
| 7,190,080 B1 * | 3/2007 | Leu et al. | ....................... | 257/778 |
| 7,309,624 B2 * | 12/2007 | Fujimoto et al. | .............. | 438/123 |
| 7,547,971 B2 * | 6/2009 | Shinozaki et al. | ............. | 257/759 |
| 7,566,834 B2 * | 7/2009 | Shimoto et al. | ................ | 174/258 |
| 7,615,856 B2 * | 11/2009 | Sakai et al. | .................... | 257/686 |
| 2001/0013639 A1 * | 8/2001 | Abe | ................................. | 257/666 |
| 2002/0070443 A1 * | 6/2002 | Mu et al. | ........................ | 257/712 |
| 2002/0140090 A1 * | 10/2002 | Maetani | ........................ | 257/728 |
| 2004/0036180 A1 * | 2/2004 | Ho et al. | ......................... | 257/778 |
| 2004/0145044 A1 * | 7/2004 | Sugaya et al. | ................. | 257/698 |
| 2004/0155734 A1 * | 8/2004 | Kosemura et al. | ............. | 333/246 |
| 2005/0173813 A1 * | 8/2005 | Oshima | ......................... | 257/787 |
| 2005/0184377 A1 * | 8/2005 | Takeuchi et al. | ............... | 257/686 |
| 2005/0252682 A1 * | 11/2005 | Shimoto et al. | ............... | 174/260 |
| 2006/0012036 A1 | 1/2006 | Leal et al. | | |
| 2006/0065964 A1 * | 3/2006 | Ohsumi | ......................... | 257/690 |

(Continued)

OTHER PUBLICATIONS

"BCC Bump Chip Carrier," STATSChipPAC Ltd., 2 pages (May 2006).

(Continued)

*Primary Examiner* — A O Williams

(57) ABSTRACT

A semiconductor package comprises a semiconductor component (e.g., a die) and a via at least partially covered by an encapsulant. The encapsulant forms substantially parallel top and bottom surfaces, with at least part of the via being exposed on the top surface. At least one conductive pad is exposed on the bottom surface, and the via can electrically couple the top and bottom surfaces, as well as couple the semiconductor component at the top and bottom surfaces. An additional semiconductor component can be coupled to the top surface with a circuit pattern formed on the top surface and coupled to the via.

26 Claims, 9 Drawing Sheets

U.S. PATENT DOCUMENTS

| | | | |
|---|---|---|---|
| 2006/0216868 A1* | 9/2006 | Yang et al. | 438/125 |
| 2006/0232938 A1* | 10/2006 | Yeh | 361/704 |
| 2007/0018313 A1* | 1/2007 | Gomyo et al. | 257/723 |
| 2007/0119615 A1* | 5/2007 | Kobayashi | 174/250 |
| 2007/0175658 A1* | 8/2007 | Audet et al. | 174/260 |
| 2008/0023805 A1* | 1/2008 | Howard et al. | 257/666 |
| 2008/0029865 A1* | 2/2008 | Bauer et al. | 257/684 |
| 2008/0303153 A1* | 12/2008 | Oi et al. | 257/738 |
| 2009/0020882 A1* | 1/2009 | Hasegawa | 257/773 |
| 2009/0057901 A1* | 3/2009 | Lin et al. | 257/738 |
| 2009/0130801 A1* | 5/2009 | Fukuda et al. | 438/123 |
| 2009/0218678 A1* | 9/2009 | Kawabata et al. | 257/698 |
| 2009/0242255 A1* | 10/2009 | Taniguchi et al. | 174/260 |
| 2009/0267171 A1* | 10/2009 | Yean et al. | 257/434 |
| 2010/0027225 A1* | 2/2010 | Yuda et al. | 361/736 |

OTHER PUBLICATIONS

Beth Keser, "Redistributed Chip Packaging," *Semiconductor International*, http://www.reed-electronics.com/semiconductor/indes.asp?layout=article..., pp. 1-5 (Apr. 1, 2007).

"Redistributed Chip Package (RCP) TeChnology," Freescale Semiconductor (2005).

"Wire Bond and Beyond: Semiconductor Packaging Innovations," Freescale Semiconductor, Inc., Doc. No. WIREBONDBYNDWP, Rev. 0 (Jul. 2006).

* cited by examiner

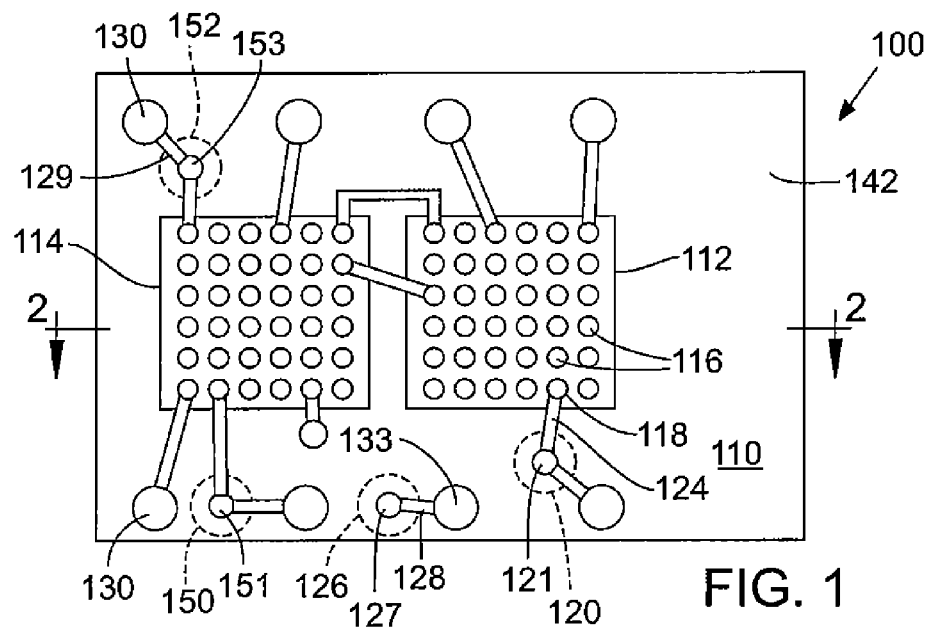
FIG. 1
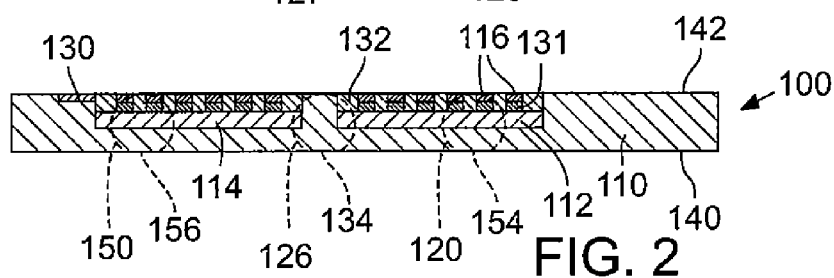
FIG. 2
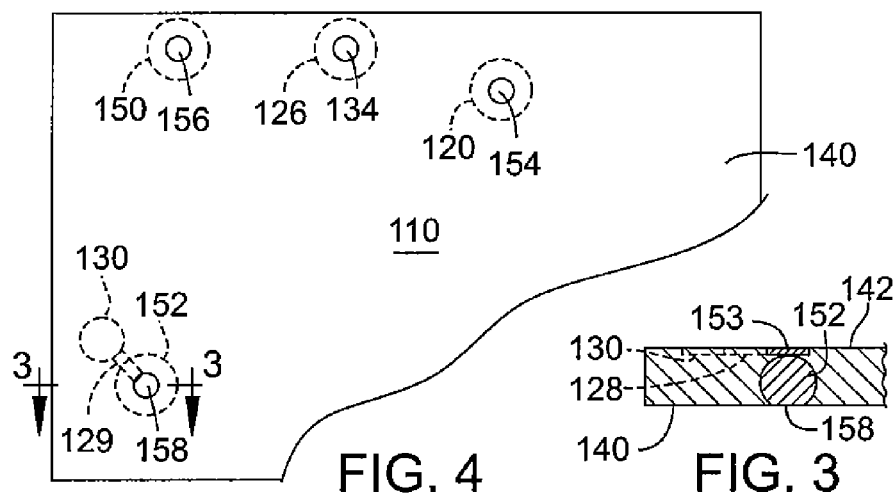
FIG. 4
FIG. 3

SEMICONDUCTOR PACKAGING SYSTEM WITH STACKING AND METHOD OF MANUFACTURING THEREOF

FIELD

The disclosure pertains to packages for semiconductor components such as, for example, semiconductor die.

BACKGROUND

Electronic devices often employ multiple semiconductor components such as semiconductor die or packaged components. Some packaged components use a leadframe for support during the packaging process. In some packaging processes, the leadframe is removed after other parts of the package are formed. An example of such a package is a bump chip carrier (BCC) package. Unfortunately, use of a leadframe tends to increase package size and thickness.

One method of reducing the size of chip packages is to stack components vertically so as to increase the effective circuit density. However, stacking components vertically tends to be practical only if at least some of the stacked components can be electrically coupled to each other. If such coupling is unavailable or limited, the size advantage offered by vertical stacking tends to be unrealized. For these and other reasons, improved semiconductor packages and packaging methods are needed to realize compact circuit packages of increasing circuit density.

SUMMARY

A semiconductor package comprises a semiconductor component (e.g., a die) and a via at least partially covered by an encapsulant and coupled to respective conductive pads. The encapsulant forms substantially parallel top and bottom surfaces, with at least part of the via being exposed on the top surface. At least one conductive pad is exposed on the bottom surface, and the via can electrically couple the top and bottom surfaces, as well as couple the component with the top and bottom surfaces. An additional semiconductor component can be coupled to the top surface through, for example, a circuit pattern formed on the top surface and coupled to the via. Such a package (with or without a via) can be embedded in a substrate.

In one example, a circuit assembly comprises an encapsulant layer defining a first major surface and a second major surface, wherein the first major surface is substantially parallel to the second major surface. A first semiconductor component (a die or a packaged device) includes at least one termination that is situated substantially at the first major surface, wherein the first semiconductor component is coupled to one or more pads through one or more conductive bumps positioned between the first major surface and the second major surface, and a via is situated substantially in the encapsulant layer. The via is configured to provide an electrical coupling between the first major surface and the second major surface. In some examples, the via penetrates the encapsulant layer substantially at the first major surface and is formed as a conductive spheroid or a stud bump. In other examples, the via is defined as a portion of a lead frame. In additional examples, a conductive trace is coupled to the via and to the first semiconductor component substantially at the second major surface. In one example, the conductive trace and the via are of unitary one-piece construction. In additional representative examples, a plurality of vias is configured to provide electrical coupling between the first major surface and the second major surface. In further examples, a circuit pattern is defined on the first major surface and is electrically coupled to the first semiconductor device. In still additional examples, a second semiconductor component includes at least one termination situated substantially at the first major surface, and is coupled to the circuit pattern. In some examples, circuit assemblies provide electrical connection to bond pads or conductive traces at the second major surface using one or more bond wires. In further examples, a separation of the first major surface and the second major surface is between about 0.1 mm and about 1.0 mm. In additional examples, the separation is between about 0.45 mm and about 0.90 mm. In some embodiments, the circuit assembly can be at least partially embedded in a substrate. Additionally, the semiconductor component can be coupled to one or more pads in a flipchip configuration.

Methods of making a circuit assembly comprise encapsulating at least a portion of a first circuit component and a portion of at least one via secured to a leadframe, thereby forming an encapsulant layer. At least a portion of the leadframe is removed by etching, grinding, or other process to expose at least one electrical connection to the circuit component. In some examples, the encapsulant layer completely covers the via, and a portion of the encapsulant layer is removed so as to expose a portion of the via so that the via provides electrical coupling through the encapsulant layer. In additional representative examples, the circuit component is electrically coupled to a first conductive pad on the leadframe, and the via is electrically coupled to a second conductive pad on leadframe. In further examples, the encapsulant layer defines a first major surface and a second major surface, wherein the first major surface is substantially parallel to the second major surface, and the method further comprises coupling the first circuit component to one or more conductive pads through one or more conductive bumps positioned between the first major surface and the second major surface. In other representative examples, the encapsulant layer is defined by a first layer surface at the leadframe and a second layer surface that is substantially parallel to the first surface, and at least one bond pad is provided on the second layer surface. In additional representative examples, a second circuit component is secured to the second layer surface and electrically coupled to a via or to the bond pad. Additionally, the semiconductor component can be a semiconductor die, and can be coupled to the one or more pads in a flipchip configuration.

Packaged semiconductor devices can comprise at least one semiconductor die, coupled to one or more pads through one or more conductive bumps, and an encapsulant layer into which the semiconductor die is at least partially embedded, the encapsulant layer defining substantially parallel first and second major surfaces with the one or more conductive bumps being positioned between the first and second major surfaces. A via is substantially embedded in the encapsulant layer and is configured to provide electrical coupling through the encapsulant layer. In some examples, the encapsulant layer comprises an underfill layer situated to substantially fill voids between the conductive bumps.

The foregoing and other features and advantages of the disclosed technologies will become more apparent from the following detailed description, which proceeds with reference to the accompanying drawings.

BRIEF DESCRIPTION OF THE DRAWINGS

FIG. 1 is a plan view of one embodiment of a semiconductor package.

FIGS. 2-3 are cross-sectional views of the semiconductor package of FIG. 1.

FIG. 4 is an additional plan view of the semiconductor package of FIG. 1.

DETAILED DESCRIPTION

Figure 5:
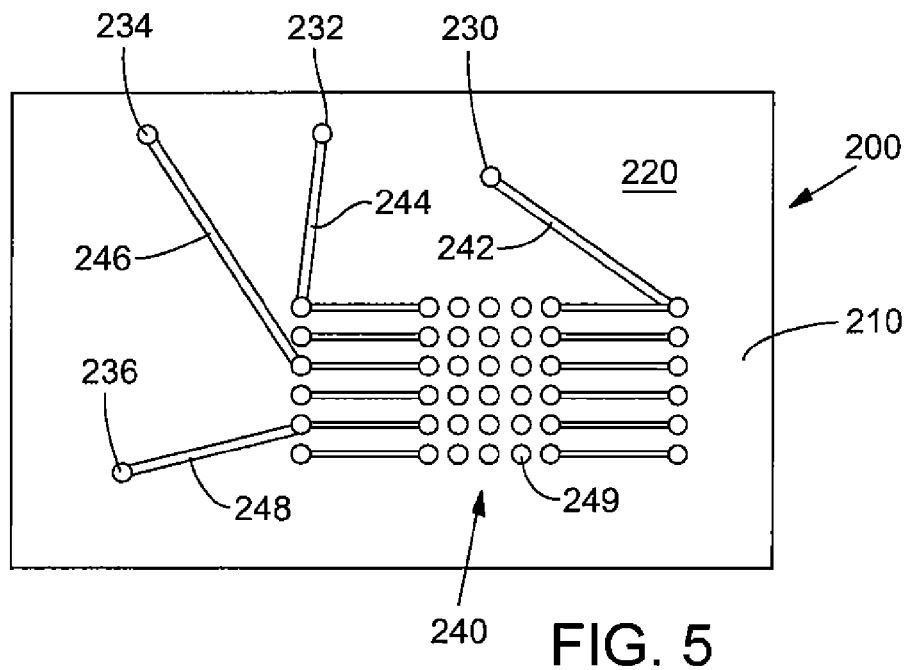
FIG. 5 is a plan view of another embodiment of a semiconductor package.

As used in this application and in the claims, the singular forms "a," "an" and "the" include the plural forms unless the context clearly dictates otherwise. Additionally, the term "includes" means "comprises." Further, the term "coupled" means electrically, electromagnetically or mechanically coupled or linked and does not exclude the presence of intermediate elements between the coupled items.

Although the operations of example embodiments of the disclosed method are described in a particular, sequential order for convenient presentation, it should be understood that disclosed embodiments can encompass an order of operations other than the particular, sequential order disclosed. For example, operations described sequentially may in some cases be rearranged or performed concurrently. Moreover, for the sake of simplicity, the attached figures may not show the various ways (readily discernable, based on this disclosure, by one of ordinary skill in the art) in which the disclosed system, method, and apparatus can be used in conjunction with other systems, methods, and apparatuses. Additionally, the description sometimes uses terms like "produce" and "provide" to describe the disclosed method. These terms are high-level abstractions of the actual operations that can be performed. For example, "providing" a component can mean making that component available for use or configuration with additional components. The actual operations that correspond to these terms can vary depending on the particular implementation and are, based on this disclosure, readily discernible by one of ordinary skill in the art.

The term "horizontal" as used herein is defined as being in the plane of the major planar opposed surfaces of the appropriate component, regardless of the component's orientation. The term "vertical" refers to a direction generally perpendicular to the horizontal as just defined. Terms, such as "on," "above," "below," "bottom," "top," "side," "higher," "lower," and "under," are defined with respect to the horizontal plane. The term "layer" refers to layers that completely or partially cover a surface, and includes a layer having voids or portions in which components are embedded. "Termination" is used generally to refer to electrical connections such as bond pads, solder balls, or other electrical contacts. "Circuit assembly" refers to various combinations of circuit components such as semiconductor die, resistors, capacitors, inductors, diodes, and supporting structures such as leadframes and circuit substrates. Circuit assemblies also typically can include bond wires, encapsulants, and other structural, thermal, or electrical elements.

A representative semiconductor package 100 is illustrated in FIGS. 1-4. FIGS. 1 and 4 are plan views from opposite sides (FIG. 4 showing only a portion of the package 100), and FIGS. 2-3 are sectional views. The semiconductor package 100 comprises an encapsulant layer 110 and semiconductor components 112, 114 that are at least partially encased in the encapsulant layer 110. In the depicted embodiment, the components 112, 114 are semiconductor die, but in other embodiments the components 112, 114 can be discrete components such as resistors, capacitors, packaged components, or combinations thereof. The encapsulant layer 110 can be formed by, for example, molding an encapsulant material around the components 112, 114, transfer molding screen printing, liquid encapsulation or by other processes. The components 112, 114 are typically electrically coupled to one or more pads 116 arranged in a flipchip configuration or otherwise configured for electrical coupling to other packaged or discrete devices. In some embodiments, the components 112, 114 can be coupled to a circuit substrate, such as a circuit board or a hybrid substrate. The encapsulant layer 110 has a first major surface 140 and a second major surface 142, and the components 112, 114 are situated at least partially between the first major surface 140 and the second major surface 142. The pads 116 are typically situated in a plane that is substantially co-planar with the second major surface 142.

One or more vias, such as vias 120, 126, 150, 152 can be provided. As shown in FIGS. 1-4, the vias 120, 126, 150, 152 comprise conductive spheres such as, for example, solder balls, metal or metallic alloy balls, solder-coated metal balls, or metallic (or conductive) core solder balls. In other examples, different types of vias can be used as described below. The vias 120, 126, 150, 152 are typically situated to provide electrical coupling between the first and second major surfaces 140, 142 of the encapsulant layer 110 to permit electrical connections to the components 112, 114 or to conductive traces situated at one or both of the first and second major surfaces 140, 142. As shown in FIG. 1, the via 120 contacts a pad 121 that is in turn coupled to a conductive trace 124 that extends to a pad 118 that is in communication with the component 112. In another example, the via 126 is coupled to a pad 133 by a pad 127 and a conductive trace 128. As shown in FIG. 1, the pad 133 is not directly coupled to either of the components 112, 114. Pads and conductive traces are typically formed of conductive materials such as, for example, gold or copper.

The components 112, 114 are attached to the pads 116 with solder bumps and/or gold stud bumps (such as bump 131) using, for example, solder reflow or thermo-compression bonding methods. In some embodiments, the package 100 further comprises a resin 132 situated beneath the components 112, 114 and that fills or partially fills any voids between pads such as the pads 116. The resin 132 can be an epoxy mold compound or other resin and can be provided by, for example, printing encapsulation, transfer molding, no-flow underfill dispensing, or other molding, underfilling, or encapsulation process. In this example, portions of at least some of the vias 120, 126, 150, 152 are exposed at the first major surface 140. For example, as shown in FIG. 3, a surface 158 of via 152 is exposed at the first major surface 140.

Referring to FIG. 4, via surfaces 154, 134, 156, 158 of vias 120, 126, 150, 152 respectively, are exposed.

In some embodiments, via surfaces such as those shown in FIGS. 3 and 4 can be used for additional electrical connections at the first major surface 140. For example, FIG. 5 is a plan view of another embodiment of a semiconductor package 200 that is similar to the package 100 described above. The package 200 comprises an encapsulant layer 220 having a major surface 210 at which via surfaces 230, 232, 234, 236 are exposed. The package farther comprises a circuit pattern 240 on the major surface 210. In some examples, the circuit pattern 240 can be made using a variety of methods, for example, sputtering, vapor deposition, electroless plating, or electrolytic plating. The via surfaces 230, 232, 234, 236 can be coupled to the circuit pattern 240 using one or more conductive traces, such as conductive traces 242, 244, 246, 248. In some examples, pads can be provided for connection of via surfaces and circuit traces. An array of pads such as pad 249 can be provided for connection of additional circuits or semiconductor devices or die.

Figure 6:
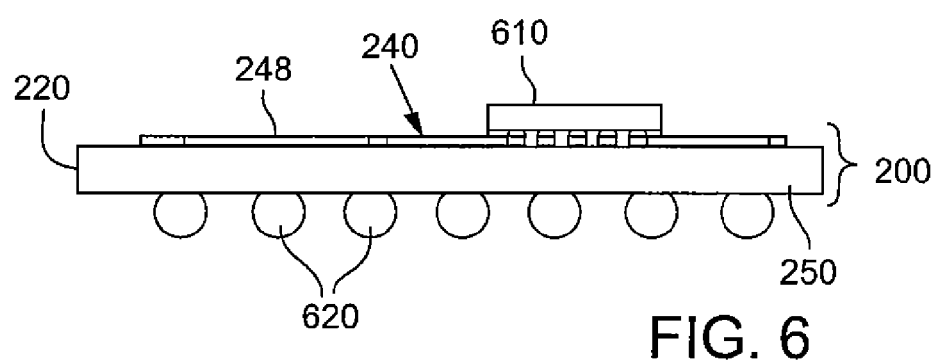
FIG. 6 is a sectional view of the semiconductor package of FIG. 5 illustrating attachment of a semiconductor component.

As shown in FIG. 6, the semiconductor package 200 of FIG. 5 is coupled to an additional semiconductor component 610 with the circuit pattern 240. Additional active or passive circuit components can be connected to one or more pads or conductive traces of the circuit pattern 240. In the example of FIG. 6, the component 610 is a die configured for flipchip mounting. In other examples, additional components can be electrically connected using wirebonds. In some embodiments, several packages similar to the package 200 can be stacked and electrically connected using circuit patterns formed on a major surface of an encapsulant layer. In some examples, the additional component 610 can also be partially or completely covered with an encapsulant. As shown in FIG. 6, solder balls 620 are situated at a second major surface 250 of the encapsulant layer 220 for coupling in a ball grid array (BGA) configuration. In another embodiment, a land grid array (LGA) can be fabricated at the major surface 250. Using BGA, LGA, or other configurations, the package 200 can be coupled to a circuit board or to additional dies, packages, or discrete components.

Figure 22:
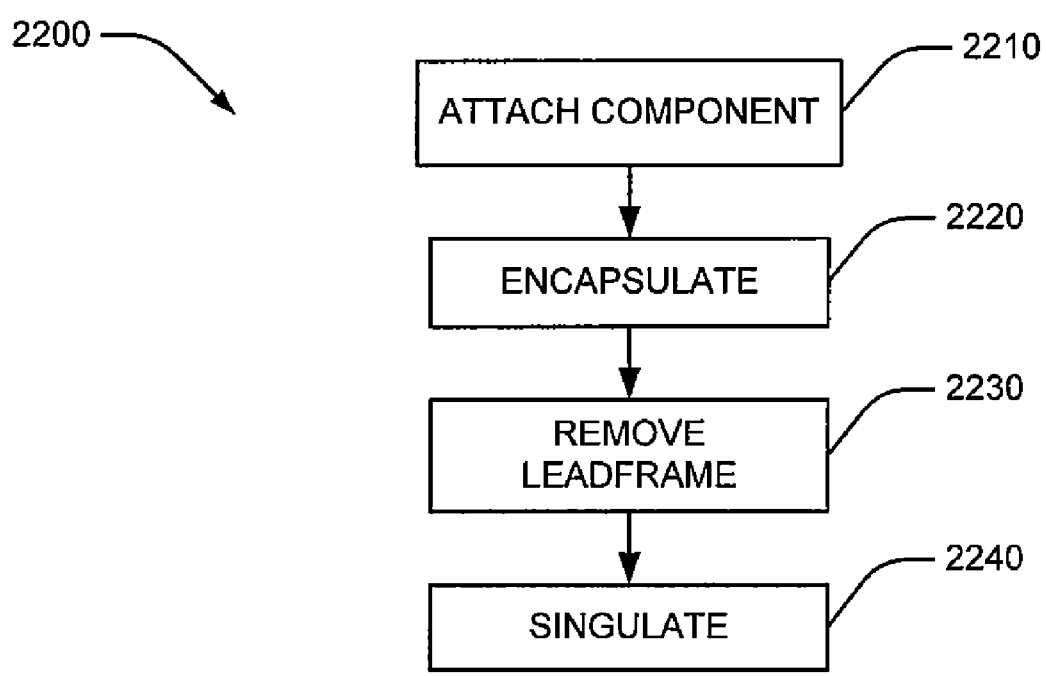
FIG. 22 is a block diagram of a representative method of semiconductor package fabrication.

FIG. 22 shows a block diagram of a representative example of a method 2200 of making a semiconductor package. In a step 2210, a semiconductor component is attached (e.g., coupled) to a leadframe. In some embodiments, the leadframe comprises one or more conductive pads and/or conductive traces. In further embodiments, at least some of the conductive pads and/or conductive traces are configured to receive the semiconductor component. In additional embodiments, the leadframe can be in a strip and/or matrix format. In a step 2220, at least a portion of the component is encapsulated. In a step 2230, at least a portion of the leadframe is removed, as explained in more detail below. In some embodiments, two or more components can be separated by singulation, as in a step 2240.

Figure 7:
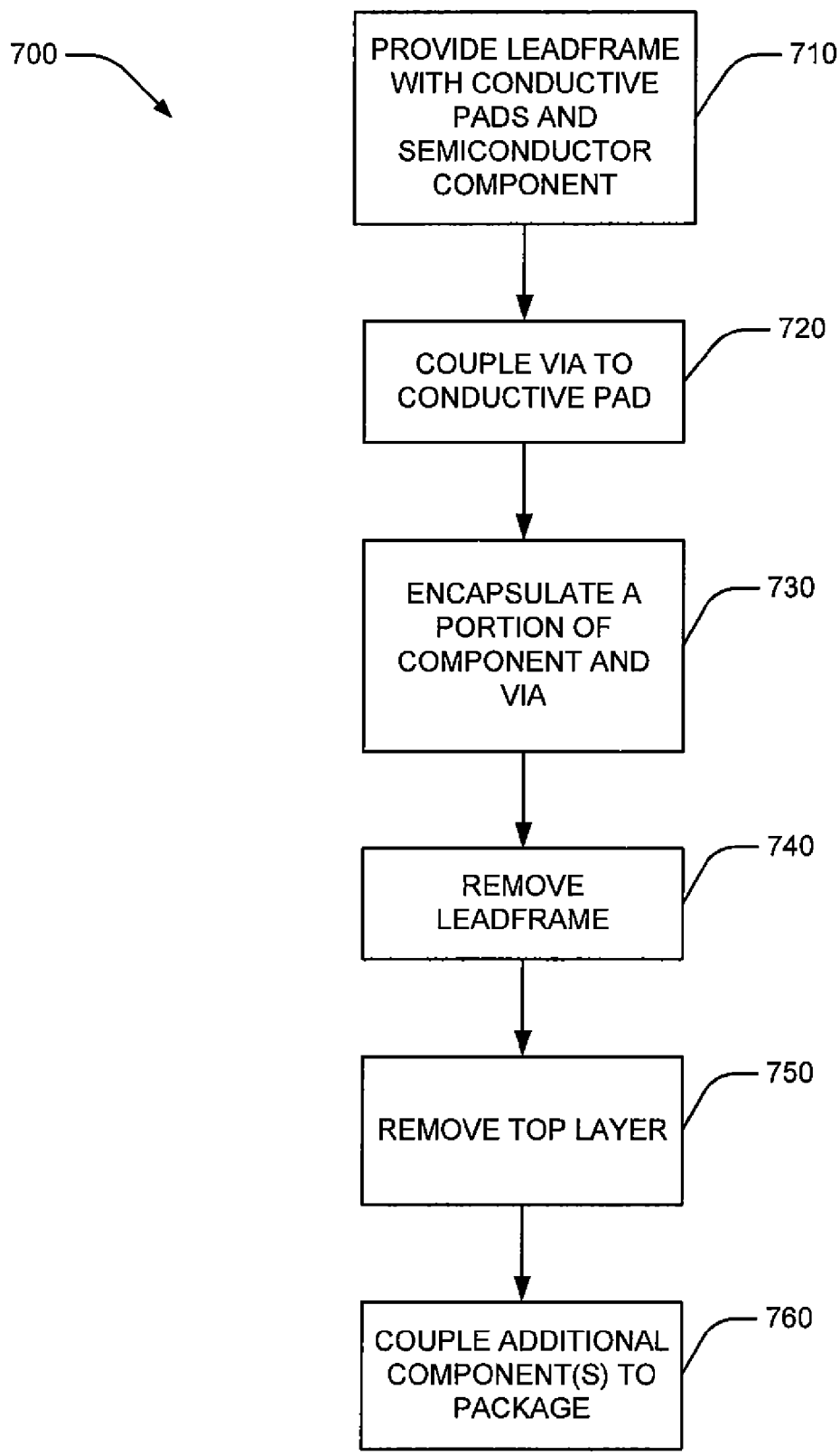
FIG. 7 is a block diagram of a representative method of semiconductor package fabrication.

FIG. 7 is block diagram illustrating a representative example of a method 700 of making a package such as the semiconductor package 100. In a step 710, a leadframe comprising one or more conductive pads and to which one or more semiconductor die are secured is provided. The leadframe is typically formed from a copper alloy or other metallic sheet by stamping or etching and is finished by plating, taping, and downsetting. In typical examples, the leadframe includes a die mounting paddle and lead fingers. The die mounting paddle is configured to support the die and the lead fingers are configured for electrical connections between the die and external circuit components. In some examples, a die secured to the leadframe paddle is coupled to the leadfingers with one or more wire bonds or tape automated bonds. Circuit components other than die can be secured to a leadframe. For example, circuit substrates such as circuit boards, hybrid substrates, or other substrates that include additional circuit components (such as semiconductor die) can be secured to the leadframe. Depending on the preferred numbers and arrangements of leads, a single-sided, dual-sided, or four-sided leadframe can be selected. In addition, a leadframe associated with a single finished circuit assembly or circuit package can be provided, or a strip or other plurality of attached leadframes can be provided, and individual completed or partially completed packages obtained by singulation.

In a step 720, one or more vias are coupled to one or more conductive pads or conductive traces on the leadframe. The vias can be provided as, for example, conductive spheres. In a step 730, at least some portions of the circuit components (for example, semiconductor die) coupled to the leadframe and some portions of the vias are encapsulated. In some embodiments, all exposed surfaces of the vias and circuit components are encapsulated. In a step 740, the leadframe is removed from the package by, for example, etching, grinding, or other chemical or mechanical processes. In order to provide convenient access to the vias, portions of the encapsulant that cover the vias can be removed in a step 750 to complete the semiconductor package. Additional components can be secured to the encapsulant layer in a step 760, if desired. In at least some embodiments, the method of 700 can be used to make packages with a wafer-lever redistribution layer process.

Figure 8:
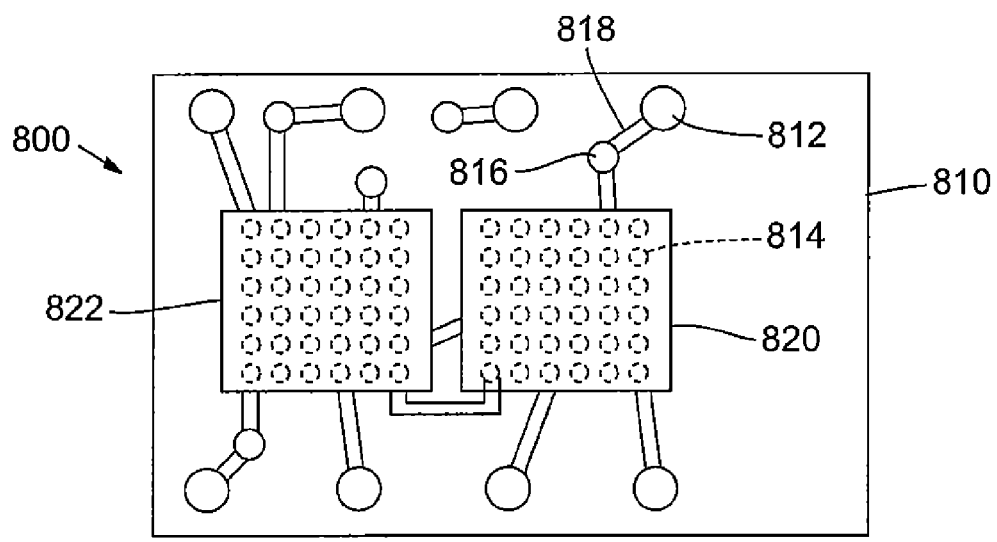
FIG. 8 is plan view of one embodiment of a leadframe assembly.
Figure 9:
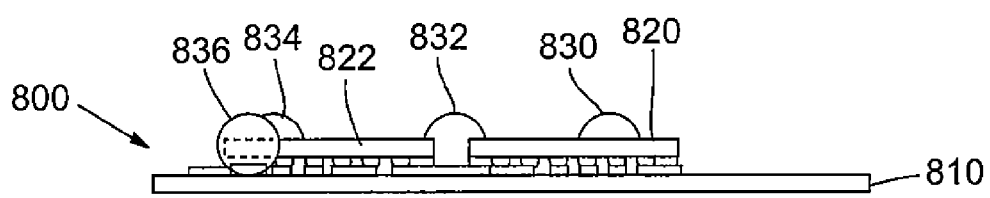
FIG. 9 is a side view of one embodiment of the assembly of FIG. 8 after vias are attached.

The method of FIG. 7 is further illustrated in FIGS. 8-11. With reference to FIG. 8, a leadframe assembly 800 comprises a leadframe 810 that includes a plurality of conductive pads such as pads 812, 814, 816. Some pads are coupled to one or more other pads by conductive traces such as a conductive trace 818. In the example of FIG. 8, the leadframe assembly 800 includes two semiconductor die 820, 822 that are coupled to a plurality of pads such as pad 814 in a so-called "flipchip" configuration. As shown in FIG. 9, vias can be provided as, for example, conductive spheres 830, 832, 834, 836 that are coupled to pads on the leadframe assembly 800.

Figure 10:
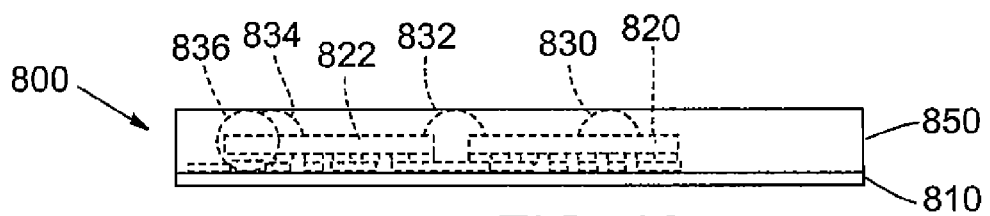
FIG. 10 is a side view of one embodiment of a semiconductor package.

At least some portions of the components (e.g., die 820, 822) and a portion of the vias 830, 832, 834, 836 are encapsulated with an encapsulant layer 850 as shown in FIG. 10. In the example of FIG. 10, all exposed surfaces of the vias and semiconductor components are encapsulated, but in other examples, only selected portions of the vias and the semiconductor components are encapsulated.

Figure 11:
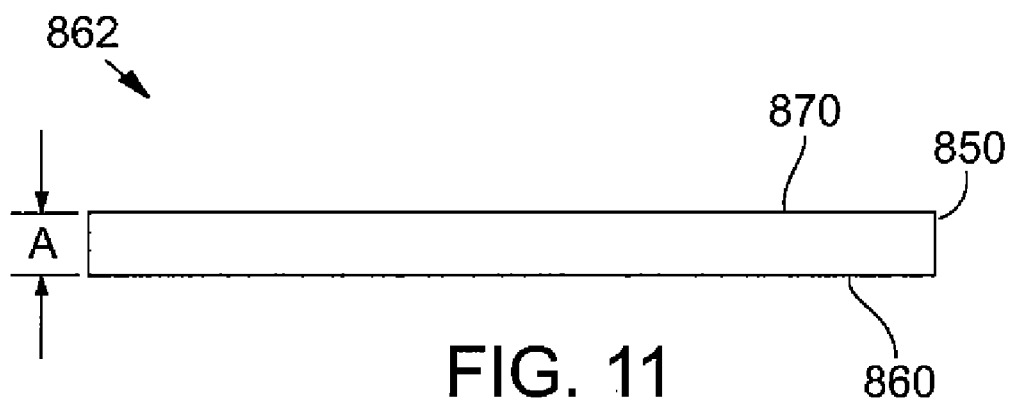
FIG. 11 is a side view of one embodiment of a semiconductor package.

FIG. 11 shows a side view of a circuit assembly 862 with the leadframe 810 removed. In some embodiments the entire leadframe is removed, while in other embodiments only a portion is removed. Removing the leadframe can expose portions of one or more pads and/or one or more traces, such as pads 812, 814, 816 and trace 818 that are shown in FIG. 8. As a result, a circuit assembly can be produced in which the encapsulant layer has a first major surface 870 that can completely cover the conductive spheres 830, 832, 834, 836 and a second major surface 860 that is substantially coplanar with one or more pads and circuit traces and/or can support at least one pad or conductive trace. In other examples, exposed pads and/or conductive traces can protrude slightly from the second major surface 860 but are still referred to herein as being substantially coplanar with the second major surface 860. In some examples, the encapsulant layer 850 is thinned at the first major surface 870 by etching or other processes so as to expose portions of one or more of the conductive spheres 830, 832, 834, 836 and/or generally reduce the height of the package 800. In some embodiments a height A of the package can range, for example, from about 0.1 mm to about 1.0 mm. In further embodiments height A can range, for example, from about 0.45 mm to about 0.90 mm.

Figure 12:
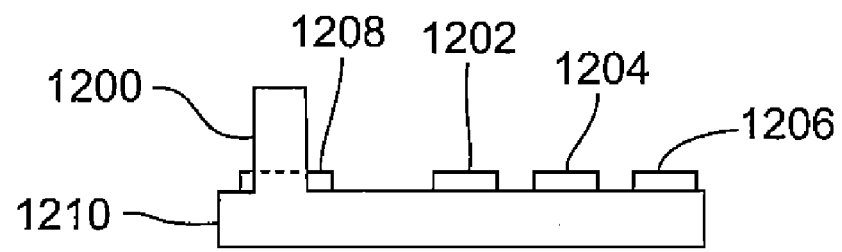
FIG. 12 is a side view of one embodiment of a via.

The foregoing embodiments are described as using a via comprising a conductive spheroid. A conductive spheroid via can often be attached to a conductive pad by a single pass solder reflow process. Other embodiments can use other types of vias. For example, FIG. 12 shows a side view of one embodiment of a post via 1200 that is formed as part of a leadframe 1210 using, for example, a half-etching process. In addition to the post via, pads 1202, 1204, 1206 are provided. One or more conductive traces can also be provided on the leadframe 1210. The via 1200 can be made of one or more materials such as a copper-based alloy or a ferrous-based alloy. In some embodiments, a conductive component such as a via capture pad 1208 can be used to couple the via 1200 to one or more components. In further embodiments the capture pad 1208 can completely or partially encircle the via 1200. The post via 1200 of FIG. 12 is of unitary, one-piece construction with the leadframe 1210.

Figure 13:
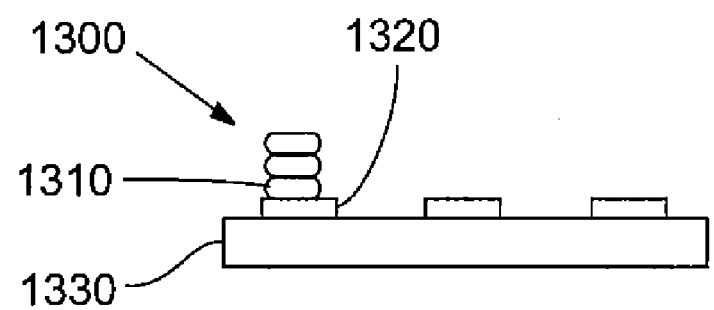
FIG. 13 is a side view of another embodiment of a via.

FIG. 13 is a side view of an embodiment of a stud via 1300. This type of via can be formed using one or more stud bumps 1310. In some examples, the stud via 1300 is formed on a conductive pad 1320 on a leadframe 1330. In some embodiments, the stud via 1300 can provide a relatively high level of flexibility in positioning the via on a leadframe, and can also be used to form a fine pitch, relatively high aspect ratio via structure.

While conductive spheres, post vias, and stud vias can be convenient, other types of vias can also be used. Generally, any configuration that provides adequate electrical coupling through an encapsulant layer such as the layer 850 of FIG. 10 can be used. In some examples, one or more via types are used in a single package.

Figure 14:
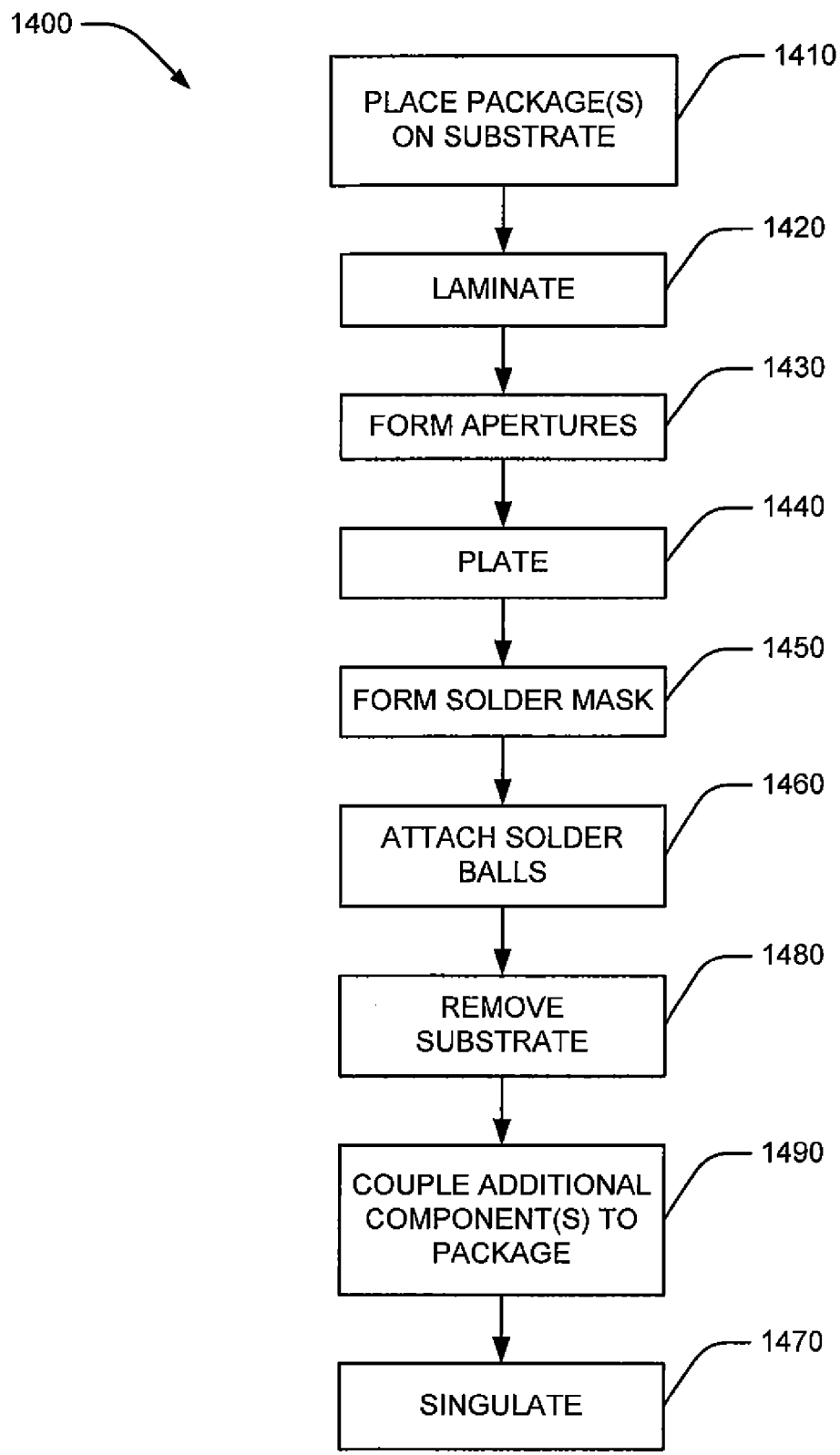
FIG. 14 is a block diagram illustrating a representative method of semiconductor packaging.

FIG. 14 is a block diagram illustrating a representative method 1400 of semiconductor packaging. Although some examples presented below do not include vias, the method 1400 can be used with circuit assemblies in which vias are included. As shown in FIG. 14, in a step 1410, packaged circuits such the molded modules illustrated in FIGS. 1-4 are situated on or secured to a substrate so that surfaces of the packaged circuits that include bond pads or other electrical connections are exposed. In a step 1420, a lamination layer, preferably a resin sheet, is provided on the exposed surfaces, and in a step 1430 the lamination layer is laser drilled to provide apertures that extend to at least some electrical connections (such as bond pads) of the packaged circuit. The lamination layer and the surfaces exposed by the apertures are then provided with an electroless copper plating and an electroplated layer in a step 1440. In a step 1450, a patterned solder mask is applied and solder balls are attached in a step 1460. Separate packages can be formed by singulation in a step 1470. In some examples, the substrate is removed in a step 1480 and additional components are coupled to the circuit assembly in a step 1490.

Figure 15:
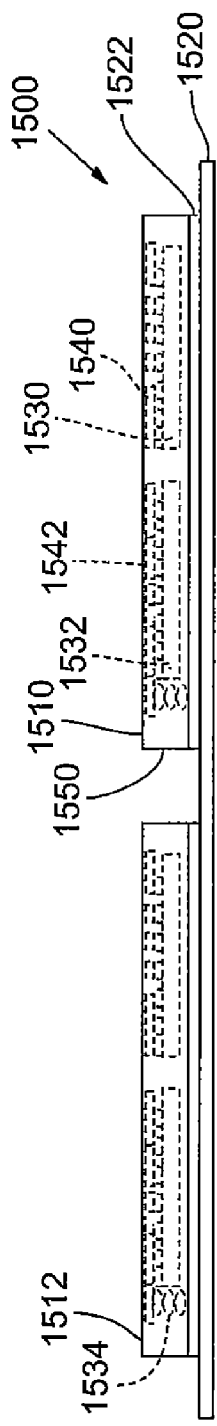
FIGS. 15-21 are side views of circuit assemblies illustrating the method of FIG. 14.
Figure 16:
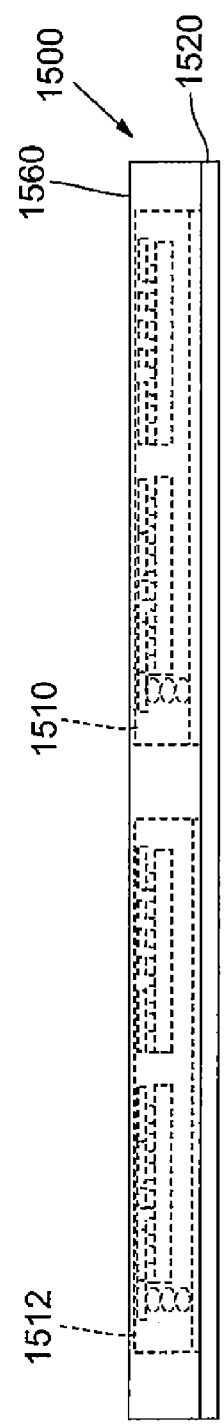
Figure 17:
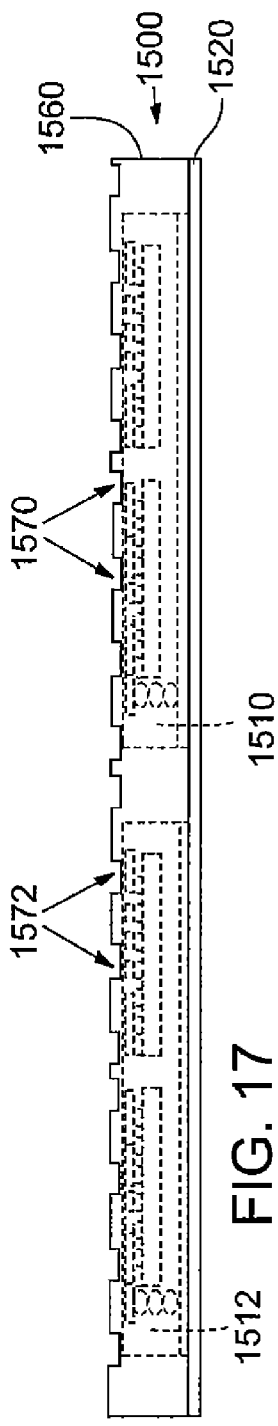
Figure 18:
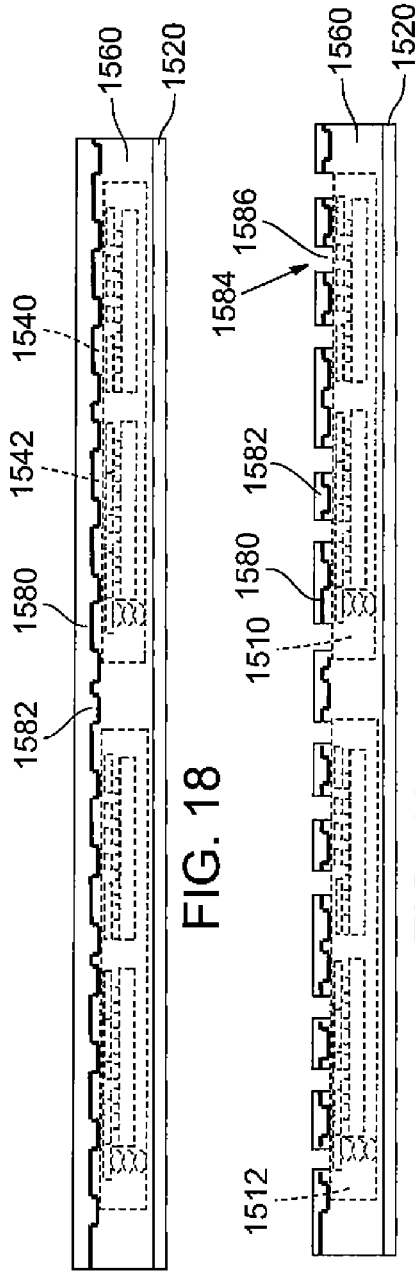

The method of FIG. 14 is illustrated in FIGS. 15-21. As shown in FIG. 15, an embedded package can be produced from one or more semiconductor packages 1510, 1512 (e.g., leadless packages, leadframe-less packages, substrate-less packages, chip-carrier-free packages) that that are placed onto a substrate 1520. In some embodiments, the packages 1510, 1512 can comprise, for example, one or more semiconductor components 1530, 1532, conductive pads 1540, 1542, a substrate 1522 and an encapsulant 1550. In further embodiments, the packages 1530, 1532 comprise one or more vias (such as via 1534), similar to the semiconductor packages described above. A lamination material 1560 is applied to at least a portion of the packages 1510, 1512 and at least a portion of the substrate 1520 as shown in FIG. 16. In some embodiments, the lamination is applied as a resin sheet. As shown in FIG. 17, one or more portions of the lamination material 1560 are removed to produce apertures such as the apertures 1570, 1572 in the lamination material 1560. In some embodiments, at least some of the lamination material 1560 can be removed using laser drilling, but other methods of forming apertures or removing the lamination material 1560 can be used. As shown in FIG. 18, a copper layer 1580 is then formed by, for example, electroless plating, so as to cover a portion of the lamination material 1560 as well as at least some of the surfaces exposed by and in the apertures in the lamination layer 1560. An electroplate layer 1582 is provided that covers at least a portion of the copper layer 1580. In some examples, the layers 1580, 1582 are electrically coupled to pads such as pads 1540, 1542 that are associated with the components 1510, 1512.

Figure 19:
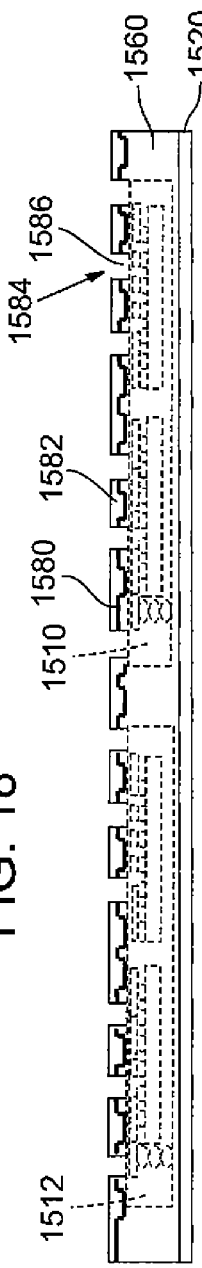
Figure 20:
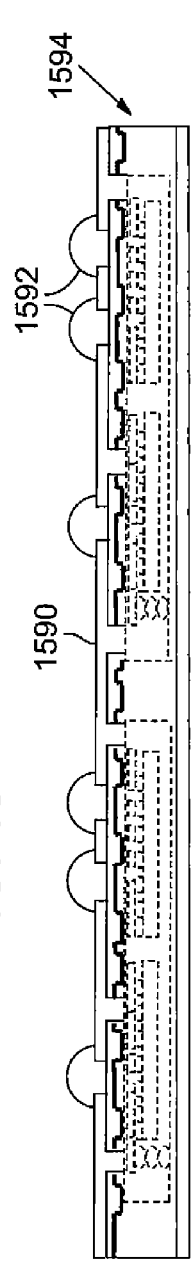

FIG. 19 shows the assembly of FIG. 18 after portions of the plating layers 1580, 1582 are removed to expose portions of the packages 1510, 1512. For example, an aperture 1584 exposes a pad 1586 on the die 1510. As shown in FIG. 20, a solder mask layer 1590 is applied and patterned by, for example, photopatterning, and solder balls 1592 are coupled in a BGA configuration to form a circuit assembly 1594 that can be coupled to additional components. In other embodiments, electrical connections can be provided using an LGA configuration. In some examples, the circuit assembly is singulated into a first package and a second package that include the components 1510, 1512, respectively.

Figure 21:
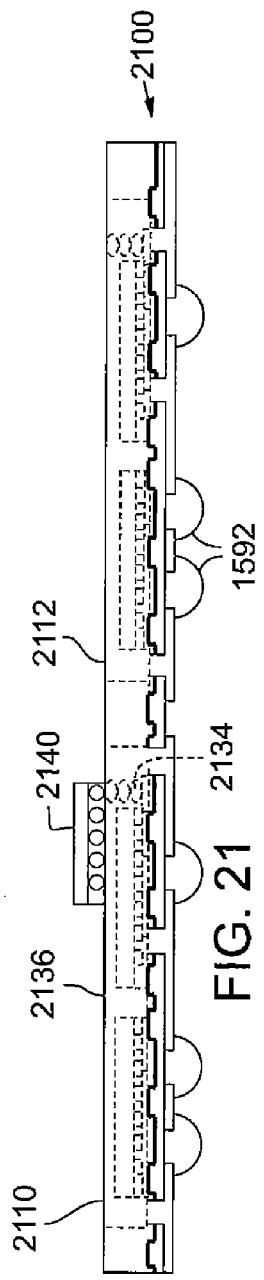

FIG. 21 illustrates package 2100 comprising semiconductor packages 2110, 2112 and is similar to the package 1594 with substrates 1520, 1522 (or portions thereof) removed. Via 2134 is exposed on the surface 2136 of the package 2100. Additionally, the package 2100 can further comprise one or more additional semiconductor components, such as an additional component 2140, which can be coupled to the package 2110 through the via 2134 and one or more other vias. In further embodiments, the package 2100 can be singulated into sub-packages. In additional embodiments, at least a portion of the additional component 2140 is covered with an encapsulant as well.

In view of the many possible embodiments to which the principles of the disclosed technology may be applied, it should be recognized that the illustrated embodiments are only representative examples and should not be taken as limiting. We therefore claim as our invention all that comes within the scope and spirit of the appended claims.

We claim:

1. A circuit assembly, comprising:
    an encapsulant layer defining a first major surface and a second major surface, wherein the first major surface is substantially parallel to the second major surface;
    a first semiconductor component positioned between the first major surface and the second major surface;
    a conductive bump attached to the first semiconductor component;
    a pad coplanar with the second major surface and coupled to the first semiconductor component with the conductive bump;
    a conductive trace and an another pad coplanar with the second major surface, the conductive trace connected to the pad and the another pad; and
    a via situated substantially in the encapsulant layer and in contact with the another pad, wherein the via is configured to provide an electrical coupling between the first major surface and the second major surface.

2. The circuit assembly of claim 1, wherein the via penetrates the encapsulant layer substantially at the first major surface.

3. The circuit assembly of claim 2, wherein the via comprises a conductive spheroid.

4. The circuit assembly of claim 2, wherein the via comprises a stud bump.

5. The circuit assembly of claim 2, wherein the via is defined as a portion of a lead frame.

6. The circuit assembly of claim 5, further comprising a conductive trace that is coupled to the via and to the first semiconductor component substantially at the second major surface.

7. The circuit assembly of claim 6, wherein the conductive trace and the via are of unitary one-piece construction.

8. The circuit assembly of claim 1, further comprising a plurality of vias configured to provide electrical coupling between the first major surface and the second major surface.

9. The circuit assembly of claim 1, further comprising a circuit pattern defined on the first major surface and coupled to the first semiconductor component.

10. The circuit assembly of claim 1, wherein a separation of the first major surface and the second major surface is between about 0.1 mm and about 1.0 mm.

11. The circuit assembly of claim 10, further comprising a second semiconductor component that includes at least one termination situated substantially at the second major surface.

12. The circuit assembly of claim 10, wherein the separation of the first major surface and the second major surface is between about 0.45 mm and about 0.90 mm.

13. The circuit assembly of claim 1, wherein the first semiconductor component at least partially encased in the encapsulant layer.

14. The circuit assembly of claim 1, further comprising at least one bond wire situated to electrically connect a first semiconductor component at the second major surface.

15. The circuit assembly of claim 14, further comprising a bond pad to which the at least one bond wire is attached.

16. The circuit assembly of claim 14, further comprising a conductive trace to which the at least one bond wire is attached.

17. The circuit assembly of claim 1, wherein the first semiconductor component, situated substantially at the second major surface, is a semiconductor die.

18. The circuit assembly of claim 17, wherein the semiconductor die is coupled to the one or more pads in a flipchip configuration.

19. The circuit assembly of claim 1, wherein the first semiconductor component is a packaged semiconductor device.

20. A method of making a circuit assembly, comprising:
encapsulating at least a portion of a first semiconductor component, a conductive bump attached to the first semiconductor component, and a portion of at least one via secured to a leadframe with an encapsulant layer having a first major surface, the at least one via connected to a pad coplanar to a surface of the encapsulant layer, a conductive trace coplanar to the surface of the encapsulant layer, and another pad, coplanar to the surface of the encapsulant layer, the another pad coupled to the first semiconductor component with the conductive bump; and
removing at least a portion of the leadframe to expose a second major surface of the encapsulation layer includes:
the second major surface substantially parallel to the first major surface with the first semiconductor component positioned between the first major surface and the second maior surface,
the pad, the another pad, and the conductive tract coplanar with the second major surface, and
the via configured to provide an electrical coupling between the first major surface and the second major surface.

21. The method of claim 20, wherein the encapsulating is configured to completely cover the at least one via, and further comprising removing a portion of the encapsulant layer so as to expose a portion of the at least one via so that the at least one via provides electrical coupling through the encapsulant layer.

22. The method of claim 20, wherein the encapsulant layer defines the first major surface and the second major surface, wherein the first major surface is substantially parallel to the second major surface, the method further comprising coupling the first circuit component to one or more conductive pads through one or more conductive bumps positioned between the first major surface and the second major surface.

23. The method of claim 20, further comprising:
electrically coupling the first semiconductor component to a first conductive pad on the leadframe; and
electrically coupling the at least one via to a second conductive pad on the leadframe.

24. The method of claim 20, wherein the encapsulant layer is defined by a first surface situated adjacent the leadframe and a second surface that is substantially parallel to the first surface, further comprising situating at least one bond pad on the second surface.

25. The method of claim 24, further comprising securing a second circuit component to the second surface.

26. The method of claim 25, further comprising electrically coupling the second circuit component to the via.

* * * * *

UNITED STATES PATENT AND TRADEMARK OFFICE
CERTIFICATE OF CORRECTION

PATENT NO. : 8,106,496 B2  
APPLICATION NO. : 11/757869  
DATED : January 31, 2012  
INVENTOR(S) : Ramakrishna et al.

Page 1 of 1

It is certified that error appears in the above-identified patent and that said Letters Patent is hereby corrected as shown below:

In the Specification:

1. Column 5, line 10, delete "farther comprises" and insert therefor --further comprises--

In the Claims:

2. Column 9, Claim 6, line 13, delete "trace that is coupled" and insert therefor --trace coupled--

3. Column 9, Claim 11, line 28, delete "component that includes" and insert therefor --component including--

4. Column 10, Claim 20, line 19, delete "the second maior" and insert therefor --the second major--

5. Column 10, Claim 20, line 20, delete "conductive tract" and insert therefor --conductive trace--

6. Column 10, Claim 21, line 28, delete "so that the" and insert therefor --so the--

7. Column 10, Claim 24, line 45, delete "surface that is substantially" and insert therefor --surface substantially--

Signed and Sealed this  
Twenty-sixth Day of April, 2016

Michelle K. Lee  
*Director of the United States Patent and Trademark Office*